(12) United States Patent
Goyal et al.

(10) Patent No.: US 8,748,350 B2
(45) Date of Patent: Jun. 10, 2014

(54) CHEMICAL SOLUTION SEED LAYER FOR RABITS TAPES

(75) Inventors: Amit Goyal, Knoxville, TN (US); Mariappan Paranthaman, Knoxville, TN (US); Sung-Hun Wee, Knoxville, TN (US)

(73) Assignees: UT-Battelle, Oak Ridge, TN (US); University of Tennessee Research Center, Knoxville, TN (US)

( * ) Notice: Subject to any disclaimer, the term of this patent is extended or adjusted under 35 U.S.C. 154(b) by 10 days.

(21) Appl. No.: 13/088,182

(22) Filed: Apr. 15, 2011

(65) Prior Publication Data

US 2012/0264615 A1 Oct. 18, 2012

(51) Int. Cl.
*H01B 12/00* (2006.01)
*H01L 39/24* (2006.01)
*H01L 39/12* (2006.01)

(52) U.S. Cl.
CPC .................................. *H01L 39/24* (2013.01);
*H01L 39/126* (2013.01)
USPC .......................... 505/300; 505/237; 505/238

(58) Field of Classification Search
CPC .............................. H01L 39/24; H01L 29/126
USPC ......................................... 505/300, 237, 238
See application file for complete search history.

(56) References Cited

U.S. PATENT DOCUMENTS

| | | | |
|---|---|---|---|
| 5,096,882 A | 3/1992 | Kato et al. | |
| 5,164,363 A | 11/1992 | Eguchi et al. | |
| 5,266,558 A | 11/1993 | Lichtenberg et al. | |
| 5,432,151 A | 7/1995 | Russo et al. | |
| 5,508,255 A * | 4/1996 | Eddy | 505/473 |
| 5,510,323 A | 4/1996 | Kamo et al. | |
| 5,543,630 A | 8/1996 | Bliss et al. | |
| 5,650,378 A | 7/1997 | Iijima et al. | |
| 5,739,086 A | 4/1998 | Goyal et al. | |
| 5,741,377 A * | 4/1998 | Goyal et al. | 148/512 |
| 5,801,105 A | 9/1998 | Yano et al. | |
| 5,846,912 A | 12/1998 | Selvamanickam et al. | |
| 5,872,080 A | 2/1999 | Arendt et al. | |
| 5,898,020 A | 4/1999 | Goyal et al. | |
| 5,958,599 A | 9/1999 | Goyal et al. | |

(Continued)

FOREIGN PATENT DOCUMENTS

| | | |
|---|---|---|
| DE | 19740964 | 3/1999 |
| EP | 0718897 | 6/1996 |

(Continued)

OTHER PUBLICATIONS

Brandle et al. "Preparation of perovskite oxides for high Tc superconductor substrates." J. Mater. Res, vol. 5, No. 10, Oct. 1990.*
Koshy et al. "Novel ceramic substrates for high Tc superconductors." Bull. Mater. Sci., vol. 22, No. 3, May 1999, pp. 243-249.*
Koshy et al. "Rare-Earth Barium Stannates: Synthesis, Characterization, and Potential Use as Substrates for YBa2Cu3O7-d Superconductor." J. Am. Ceram. Soc., 78 [11] 3088-92 (1995).*

(Continued)

*Primary Examiner* — Paul Wartalowicz
(74) *Attorney, Agent, or Firm* — Novak Druce Connolly Bove and Quigg LLP

(57) ABSTRACT

A method for making a superconducting article includes the steps of providing a biaxially textured substrate. A seed layer is then deposited. The seed layer includes a double perovskite of the formula $A_2B'B''O_6$, where A is rare earth or alkaline earth metal and B' and B" are different rare earth or transition metal cations. A superconductor layer is grown epitaxially such that the superconductor layer is supported by the seed layer.

10 Claims, 4 Drawing Sheets

(56) References Cited

U.S. PATENT DOCUMENTS

| | | | |
|---|---|---|---|
| 5,964,966 A | 10/1999 | Goyal et al. | |
| 5,968,877 A | 10/1999 | Budai et al. | |
| 6,074,990 A | 6/2000 | Pique et al. | |
| 6,077,344 A * | 6/2000 | Shoup et al. | 117/9 |
| 6,106,615 A | 8/2000 | Goyal et al. | |
| 6,114,287 A | 9/2000 | Lee et al. | |
| 6,147,033 A | 11/2000 | Youm | |
| 6,150,034 A | 11/2000 | Paranthaman et al. | |
| 6,151,610 A | 11/2000 | Senn et al. | |
| 6,154,599 A | 11/2000 | Rey | |
| 6,156,376 A | 12/2000 | Paranthaman et al. | |
| 6,159,610 A | 12/2000 | Paranthaman et al. | |
| 6,180,570 B1 | 1/2001 | Goyal | |
| 6,190,752 B1 | 2/2001 | Do et al. | |
| 6,214,772 B1 | 4/2001 | Iijima et al. | |
| 6,231,779 B1 | 5/2001 | Chiang et al. | |
| 6,235,402 B1 | 5/2001 | Shoup et al. | |
| 6,261,704 B1 | 7/2001 | Paranthaman et al. | |
| 6,265,353 B1 | 7/2001 | Kinder et al. | |
| 6,270,908 B1 | 8/2001 | Williams et al. | |
| 6,331,199 B1 | 12/2001 | Goyal et al. | |
| 6,361,598 B1 | 3/2002 | Balachandran et al. | |
| 6,375,768 B1 | 4/2002 | Goyal | |
| 6,399,154 B1 | 6/2002 | Williams et al. | |
| 6,440,211 B1 | 8/2002 | Beach et al. | |
| 6,447,714 B1 | 9/2002 | Goyal et al. | |
| 6,451,450 B1 | 9/2002 | Goyal et al. | |
| 6,468,591 B1 | 10/2002 | Paranthaman et al. | |
| 6,486,100 B1 | 11/2002 | Lee et al. | |
| 6,537,689 B2 | 3/2003 | Schoop et al. | |
| 6,555,256 B1 | 4/2003 | Christen et al. | |
| 6,599,346 B2 | 7/2003 | Goyal et al. | |
| 6,602,313 B2 | 8/2003 | Goyal et al. | |
| 6,607,313 B1 | 8/2003 | Farries et al. | |
| 6,607,838 B2 | 8/2003 | Goyal et al. | |
| 6,607,839 B2 | 8/2003 | Goyal et al. | |
| 6,610,413 B2 | 8/2003 | Goyal et al. | |
| 6,610,414 B2 | 8/2003 | Goyal et al. | |
| 6,632,539 B1 | 10/2003 | Iijima et al. | |
| 6,635,097 B2 | 10/2003 | Goyal et al. | |
| 6,645,313 B2 | 11/2003 | Goyal et al. | |
| 6,657,229 B1 | 12/2003 | Eguchi et al. | |
| 6,663,976 B2 | 12/2003 | Beach et al. | |
| 6,670,308 B2 | 12/2003 | Goyal | |
| 6,673,646 B2 | 1/2004 | Droopad | |
| 6,716,795 B2 | 4/2004 | Norton et al. | |
| 6,740,421 B1 | 5/2004 | Goyal | |
| 6,756,139 B2 | 6/2004 | Jia et al. | |
| 6,764,770 B2 | 7/2004 | Paranthaman | |
| 6,782,988 B2 | 8/2004 | Canacuzene et al. | |
| 6,784,139 B1 | 8/2004 | Sankar et al. | |
| 6,790,253 B2 | 9/2004 | Goyal et al. | |
| 6,797,030 B2 | 9/2004 | Goyal et al. | |
| 6,846,344 B2 | 1/2005 | Goyal et al. | |
| 6,867,447 B2 | 3/2005 | Summerfelt | |
| 6,872,988 B1 | 3/2005 | Goyal | |
| 6,884,527 B2 | 4/2005 | Groves et al. | |
| 6,890,369 B2 | 5/2005 | Goyal et al. | |
| 6,899,928 B1 | 5/2005 | Groves et al. | |
| 6,902,600 B2 | 6/2005 | Goval et al. | |
| 6,921,741 B2 | 7/2005 | Arendt et al. | |
| 6,956,012 B2 | 10/2005 | Paranthaman et al. | |
| 6,984,857 B2 | 1/2006 | Udayakumar et al. | |
| 7,087,113 B2 | 8/2006 | Goyal | |
| 7,090,785 B2 | 8/2006 | Chiang et al. | |
| 7,208,044 B2 | 4/2007 | Zurbuchen et al. | |
| 7,323,581 B1 | 1/2008 | Gardiner et al. | |
| 7,338,907 B2 | 3/2008 | Li et al. | |
| 7,341,978 B2 | 3/2008 | Gu et al. | |
| 7,553,799 B2 | 6/2009 | Paranthaman et al. | |
| 7,879,161 B2 | 2/2011 | Goyal | |
| 2003/0185741 A1 | 10/2003 | Matyjaszewski et al. | |
| 2004/0003768 A1 | 1/2004 | Goyal | |
| 2004/0095658 A1 | 5/2004 | Buretea et al. | |
| 2005/0013758 A1 * | 1/2005 | James et al. | 423/263 |
| 2005/0239658 A1 | 10/2005 | Paranthaman et al. | |
| 2005/0239659 A1 | 10/2005 | Xiong et al. | |
| 2006/0234066 A1 | 10/2006 | Zurbuchen | |
| 2006/0276344 A1 | 12/2006 | Paranthaman et al. | |
| 2007/0178227 A1 | 8/2007 | Hunt et al. | |
| 2007/0238619 A1 | 10/2007 | Xiong | |
| 2008/0176749 A1 | 7/2008 | Goyal | |
| 2009/0081456 A1 | 3/2009 | Goyal | |
| 2009/0088325 A1 | 4/2009 | Goyal et al. | |

FOREIGN PATENT DOCUMENTS

| | | |
|---|---|---|
| JP | 1065718 | 3/1987 |
| JP | 1100816 | 4/1989 |
| JP | 1100817 | 4/1989 |
| JP | 1220307 | 9/1989 |
| JP | 11025772 | 1/1999 |
| WO | 2008108606 | 9/2008 |

OTHER PUBLICATIONS

International Search Report and the Written Opinion of the ISA mailed on Dec. 27, 2012 in International Application No. PCT/US12/31835. (7 pages).

Koshy et al., "Novel ceramic substrates of high Tc super conductors," Bull. Mater. Sci., (1999) 22(3): 243-249.

Celik et al., "Nb-doped SrTiO3 buffer layers on LaAlO3 substrates by metalorganic deposition for YBCO superconducting films", Mat. Sci. Eng. B. (2004) 110: 96-102.

Chen et al., "Enhanced flux pinning by BaZrO3 and (Gd, Y)2O3 nanostructures in metal organic chemical vapor deposited GdYBCO high temperature superconductor tapes", Appl. Phys. Lett. (2009) 94: 062513.

Dimos et al., "Superconducting transport properties of grain boundaries in YBa2Cu3O7-$\delta$ bicrystals", Phys. Rev. B (1990) 41:4038-4049.

Goyal et al., "Conductors with controlled grain boundaries: An approach to the next generation, high temperature superconducting wire", J. of Materials Research (1997) 12: 2924-2940.

Hu et al., "MgO Nanowire Growth from Mg Metal and SiO2", Journal of Nanoscience and Nanotechnology (2004) 4(8): 1071-1075.

International Search Report and Written Opinion mailed on Jan. 12, 2010 in International Appln. No. PCT/US2010/044427.

Leonard et al., "Thickness dependence of microstructure and critical current density of Yba2Cu3O7—$\delta$ on-rolling assisted biaxially textured substrates", J.Mater Res. (2003) 18(5): 1109-1122.

Matsumoto et al., "Surface-oxidation epitaxy method to control critical current of YBa2Cu3Oz-del coated conductors", Physica C: Superconductivity (2002) 378-381: 922-926.

Motowidlo et al., "Recent Progress in High-Temperature Superconductors at Intermagnetics General Corporation", Physica C., Superconductivity (2002) 335(1-4): 44-50.

Peng et al., "2D Monte Carlo Simulation of Proton Implantation of Superconducting YBa2Cu3O7—$\delta$ Thin Films Through High Aspect Ratio Nb Masks", Nuclear Instruments and Methods in Physics Research, Section B: Beam Interactions with Materials & Atoms (2000) 165: 44-50.

Shiohara et al., "Japanese Efforts on Coated Conductor Processing and its Power Applications: New 5 Year Project for Materials and Power Applications of Coated Conductors", (M-PACC) Physica C: Superconductivity (2009) 469(15-20): 863-867.

Van Der Laan, "YBa2Cu3O7—67 Coated Conductor Cabling for Low AC-Loss and High Field Magnet Applications", Superconductivity Science Technology (2009) 22(6).

Zhang et al., "Single Liquid Source Plasma-Enhanced Metalorganic Chemical Vapor Deposition of High Quality YBa2Cu3O7—$\delta$ Thin Films", Appl. Phys. Lett. (1992) 61(24): 2884-2886.

Ahn et al., "Heterogeneous Three-Dimensional Electronics by Use of Printed Semiconductor Nanomaterials," Science vol. 314, (2006) pp. 1754-1757.

Aytug et al., "Enhanced flux pinning in MOCVD-YBCO films through Zr additions: systematic feasibility studies," Superconductor Science and Technology, vol. 23, (2010), pp. 1-7.

(56) References Cited

OTHER PUBLICATIONS

Aytug et al., "Enhancement of Flux Pinning in $YBa_2Cu_3O_{7-\delta}$ Films via Nano-Scale Modifications of Substrate Surfaces," Oak Ridge National Laboratory, Oak Ridge, TN 37831, ISBN: 978-1-60021-692-3, pp. 237-262, 2007.

Aytug et al., "ORNL-Superpower CRADA: Development of MOCVD-based IBAD-2G wires" 2008, Retrieved from URL: http://111.htspeereview.com 12008/pdfs/presentations/wednesday/2G/5_2g_ornl_superpower.pdf [retrieved on Oct. 21, 2010].

Aytug, "Deposition studies and coordinated characterization of MOVCD YBCO films on IBAD-MgO templates," Superconductor Science and Technology, vol. 22, (2009) p. 1.

Chen et al., "Metal Organic Chemical Vapor Deposition for the Fabrication of YBCO Superconducting Tapes," SuperPower Inc., Schenectady, NY 12304, ISBN: 978-1-60021-692-1, pp. 205-216, 2007.

Comini et al., "Quasi-one dimensional metal oxide semiconductors; Preparation, characterization and application as chemical sensors," Progress in Materials Science, vol. 54, No. 1 (2009) pp. 1-67.

Das et al., Novel nonlithographic quantum wire array fabrication: Physica E—Low-Dimensional Systems and Nanostructures, Elsevier Science BV, NL LNKD-DOI:10.1016/J.Physe.2005.10.015, vol. 36, No. 2, 3 (2007), pp. 133-139.

Duan et al., "Indium phosphide nanowires as building blocks for nanoscale electronic and optoelectronic devices," Optoelectronic Devices, Nature, vol. 409, (2001) pp. 66-69.

Gao, et al., Single and Binary Rare Earth $REBa_2Cu\_3O_{7-\delta}$ Thin Films Prepared by Chemical Solution Deposition, J. Phys. Conf. Series, vol. 97, (2008) pp. 1-5.

Goyal et al., "Irradiation-free, columnar defects comprised of self-assembled nanodots and nanorods resulting in strongly enhanced flux-pinning in $YBa\__2Cu_3O_{7-\delta}$ films," Superconductor Science and Technology, vol. 18, No. 11, (2005) pp. 1533-1538.

Goyal et al., "Self-assembled, ferromagnetic Co/YSZ nanocomposite films for ultrahigh density storage media," Abstract Submitted, 2009.

Han et al., "Transition Metal Oxide Core-Shell Nanowires: Generic Synthesis and Transport Studies," Nano Letters, vol. 4, No. 7, (2004) pp. 1241-1246.

Harrington et al., "Self-assembled, rare earth tantalite pyrochlore nanoparticles for superior flux pinning in $YBa_2Cu_3O_{7-\delta}$ films," Superconductor Science and Technology, Issue 2 (2009), pp. 1-5.

Haugan et al., "In-Situ Approach to Introduce Flux Pinning in YBCO," Air Force Research Laboratory, ISBN: 978-1-60021-692-3, pp. 59-77, 2007.

Hikichi et al., "Property and Structure of $YBa_2Cu_3O_{7-x}$-$Nb_2O_5$ Composite," Journal of Applied Physics, vol. 31, (1992) L1234, Col. 2 Paragraph 1.

Huang et al., "Room-Temperature Ultraviolet Nanowire Nanolasers," Science, vol. 292, (2001) pp. 1897-1899.

Javey et al., "Layer-by-Layer Assembly of Nanowires fore Three-Dimensional, Multifunctional Electronics," Nano Letters, vol. 7, No. 3 (2007) pp. 773-777.

Kang et al., "High-Performance High-$T_c$ Superconducting Wires," Science, DOI:10.1126/Science.1124872, vol. 331, No. 31 (2006), pp. 1911-SOM.

Kang et al., "Supporting material: High-performance H-$T_c$ Superconducting Wires," Science, vol. 331 (2006) 2 pp., col. 1, paragraph 3.

Kar et al., "Synthesis and Characterization of One-dimensional MgO Nanostructures," J. Nanosci. Nanotech, vol. 314, (2006) pp. 1447-1452.

Kita et al., "Effect of $Ta_2O_5$ addition on the superconducting properties of $REBa_2CU_3O_y$," Physica C: vol. 445-448, (2006) pp. 391-394.

Kuchibhatla et al., "One dimensional nanostructured materials," Progress in Materials Science, Pergamon Press, GB-LNKD DOI: 10.1016/J.Pmatsci.2006.08.001, vol. 52, No. 5 (2007) pp. 699-913.

Le et al., Systematic studies of the epitaxial growth of single-crystal ZnO nanorods on GaN using hydrothermal synthesis,: Journal of Crystal Growth, Elsevier, Amsterdam, NL LNKD-DOI:10.1016/J.Jcrysgro.2006.04.082, vol. 293, No. 1 (2006) pp. 36-42.

Lei et al., "Highly ordered nanostructures with tunable size, shape and properties: A new way to surface non-patterning using ultra-thin alumina masks," Progress in Materials Science, Pergamon Press, GB LNKD-DOI: 10.1016/J.Pmatsci.2006.07.002, vol. 52, No. 4 (2007) pp. 465-539.

Liang et al., "Preparation of Free-Standing Nanowire Arrays on Conductive Substrates," J. Am. Chem. Soc. vol. 126 (2004) pp. 16338-16339.

Lu et al., "Quasi-one-dimensional metal oxide materials-Synthesis, properties and applications," Materials Science and Engineering R: Reports, Elsevier Sequoia S.A., Lausanne, CH LNKD-DOI:10.1016/J.Mser.2006.04.002, vol. 52, No. 103, (2006) pp. 49-91.

Ma et al., "Growth and properties of YBCO-coated conductors fabricated by inclined-substrate deposition," IEE Transactions on Applied Superconductivity, vol. 15, No. 2 (2005) pp. 2970-2973.

McIntyre et al., "Metalorganic deposition of high-$J_c$ $Ba_2YCu_3O_{7-x}$ thin films from trifluoroacetate precursors onto (100) $SrTiO_3$," Journal of Applied Physics, vol. 68, No. 8 (1990) pp. 4183-4187.

Morales et al. "A laser Ablation Method for the Synthesis of Crystalline Semiconductor Nanowires," Science, vol. 279 (1998) pp. 208-211.

Nagashima et al., "Epitaxial Growth of MgO Nanowires by Pulsed Laser Deposition," J. Appl. Phys., vol. 101 (2007) pp. 124304-1 to 124304-4.

Pan et al., "Nanobelts of Semiconducting Oxides," Science, vol. 291, (2001) pp. 1947-1949.

Paranthaman et al., "Flux Pinning and AC Loss in Second Generation High Temperature Superconductor Wires," Oak Ridge National Laboratory, Oak Ridge, TN 37832, ISBN: 978-160021-692-3, pp. 3-10, 2007.

Pomar et al., "Enhanced vortex pinning in YBCO coated conductors with BZO nanoparticles from chemical solution deposition," IEEE Transactions on Applied Superconductivity, vol. 19, No. 3, (2009) pp. 3258-3261.

Saylor et al., "Experimental Method for Determining surface Energy Anisotropy and its Application to Magnesia," Journal of the American Ceramic Society, vol. 83, No. 5, (2004) pp. 1226-1232.

Selvamanickam et al., "High-current Y-Ba-Cu-O coated conductor using metal organic chemical-vapor Deposition, and ion-beam-assisted deposition," IEEE Transactions on Applied Superconductivity, vol. 11, No. 1 (2001) pp. 3379-3381.

Su et al., "Fabrication of thin films of multi-oxides ($YBa_2Cu_3O_{7-\delta}$) starting from nanoparticles of mixed ions," Superconductor Science and Technology, vol. 19, No. 11, (2006) pp. L51-L54.

Wang et al., "Growth of Nanowires," Mater. Sci. & Eng., vol. 60, No. 1-6 (2008) pp. 1-51.

Wee et al., "Enhanced flux pinning and critical current density via incorporation of self-assembled rare-earth barium tantalite nanocolumns with $YBa_2Cu_3O_{7-\delta}$ films," Physical Review B., vol. 81, No. 14 (2010) pp. 140503/1-14053/2.

Wee et al., "Formation of Self-Assembled, Double Perovskite, $Ba_2YNbO_6$ Nanocolumns and Their Contribution to Flux-Pinning and $J_c$ in Nb-Doped $YBa_2Cu_3O_{7-\delta}$ Films," Applied Physics Express, vol. 3, Issue 2, (2010) pp. 023101-023101-3.

Wee et al., "High Performance Superconducting Wire in High Applied Magnetic Fields via Nanoscale Defect Engineering," Superconductor Science and Technology, (2008) pp. 1-4.

Yamada et al., Reel-to-Reel Pulsed Laser Deposition of YBCO Thick Films, Nagoya Coated Conductor Center, Superconductivity Research Laboratory, ISTEC, 2-4-1, Mutsuno, Atsuta-ku, Nagoya, 456,-8587-Japan, 2007.

Yamada et al., "Towards the practical PLD-IBAD coated conductor fabrication—Long wire, high production rate and $J_c$ enhancement in a magnetic field," Physica C: vol. 445-448 (2006) pp. 504-508.

Yoo et al., "Electrocatalytic application of a vertical Au nanorod array using ultrathin Pt/Ru/Pt layer-by-layer coatings," Electrochimica ACTA, vol. 53, No. 1-3 (2007) pp. 3656-3662.

* cited by examiner

CHEMICAL SOLUTION SEED LAYER FOR RABITS TAPES

STATEMENT REGARDING FEDERALLY SPONSORED RESEARCH OR DEVELOPMENT

This invention was made with government support under DE-AC05-000822725 awarded by the United States Department of Energy. The Government has certain rights in the invention.

FIELD OF THE INVENTION

This invention relates to superconducting materials and more particularly to methods for making seed layers for superconducting articles.

BACKGROUND OF THE INVENTION

Successful fabrication of biaxially textured superconducting wire based on the coated conductor technology requires optimization of the cost/performance of the HTS (high temperature superconductor) conductor. From a superconducting performance standpoint, a long, large area, flexible, single crystal-like wire is required. From a cost and fabrication standpoint, an industrially scalable, low cost process is required. Both of these critical requirements are met by Rolling-assisted-biaxially-textured-substrates (RABiTS).

In order for cost/performance for a conductor based on this technology to be optimized, further work needs to be done in the area of buffer layer technology. It is now clear that while it is fairly straightforward to fabricate long lengths of biaxially textured metals or alloys, it is quite difficult to deposit high quality buffer layers using low cost processes. Requirements of buffer layers include—it should provide an effective chemical barrier for diffusion of deleterious elements from the metal to the superconductor, provide a good structural transition to the superconductor, have a high degree of crystallinity, excellent epitaxy with the biaxially textured metal template, have good mechanical properties, high electrical and thermal conductivity and should be able to be deposited at high rates.

Buffer layers play a key role in high-temperature superconductor (HTS) materials, particularly in second-generation rare-earth-barium-copper-oxide (REBCO), especially yttrium-barium-copper-oxide (YBCO) wire technology. The purpose of the buffer layers is to provide a continuous, smooth and chemically inert surface for the growth of the YBCO film, while transferring the biaxial texture from the substrate to the YBCO. Buffer layers are important for preventing metal diffusion from the substrate into the superconductor, and as oxygen diffusion barriers. Nickel can poison the YBCO layer, destroying the superconductive properties. To transfer the texture from the template to the superconductor while preventing the diffusion of nickel and tungsten metal to the YBCO film, buffer layers are needed. These insulating layers also reduce both alternating current (ac) losses and the thermal expansion mismatch between the crystal lattices of the substrate and the superconductor. Multi-layer architectures have been developed that also provide mechanical stability and good adhesion to the substrate.

It is important that the highly aligned buffer materials are matched in both the lattice constant and thermal expansion to the biaxially textured substrate and the YBCO layer. The buffer layers should be smooth, continuous, crack-free and dense. Even though the buffer layers are much thinner than the YBCO layer, buffer deposition cost is a substantial part of the total conductor cost.

When growing an epitaxial oxide film on a metal surface it is essential to avoid oxide formation before the nucleation of the layer is complete. For example YBCO is typically grown in an atmosphere containing 100 ppm or more of oxygen at 750-800° C. Under such conditions Ni and W will form various native oxides on a NiW surface. Most of such oxide layers do not offer the bi-axial cubic texture required for high critical currents in the HTS layer. However, the ability of certain oxide films to be grown in very low oxygen partial pressures, i.e. below the oxidation of Ni and even W can be utilized.

Although it is possible to grow oxide buffers directly on textured metal surfaces under suitable reducing conditions, oxygen penetrates through the buffer layers such as yttrium oxide, yttria stabilized zirconia, cerium oxide, and lanthanum zirconium oxide (LZO) to the metal oxide interface during the YBCO processing. This is mainly because the oxygen diffusivity of the buffer layer materials at 800° C. is in the range of $10^{-9}$ to $10^{-10}$ cm$^2$/sec. The diffusion is more rapid in structures that are more prone to the occurrence of defects. Grain boundaries, pinholes and particulates can also provide diffusion paths in these films. In most instances the oxidation of the metal substrate cannot be suppressed completely. Thin homogeneous oxide layers are observed after final processing of the conductor without negative impact on the performance. Uncontrolled growth of substrate oxides, however, can result in multiple failures. Rapid and inhomogeneous oxide growth can penetrate the buffer layers and cause deterioration of the barrier properties of the buffer layer. For example, when excessive NiO is formed the full buffer layer stack can delaminate from the metal substrate due to volume expansion of, for example, Ni relative to NiO. The characteristics of the buffer layer can control the extent of oxide layer formation at the interface between the buffer and the substrate.

Buffer layers can be formed by multiple layers of materials which each serve a particular purpose. A thin seed layer is deposited directly on the substrate first, to subsequently allow the growth of the full buffer and finally the YBCO processing at higher oxygen levels. The function of a seed layer is to protect the substrate from oxidation during the formation of subsequent layers, which can include additional buffer layers and the superconductor layer, and also to provide an epitaxial template for growth of these subsequent layers.

One example of a buffer layer stack of the prior art includes the use of YSZ and $CeO_2$, typically in a configuration of $CeO_2$ (or $Y_2O_3$)/YSZ/$CeO_2$. The purpose of the first buffer layer, or seed layer, is to provide a good epitaxial oxide layer on the reactive, biaxially textured Ni substrate without the formation of undesirable NiO. $CeO_2$ is particularly useful in this regard due to its ability to very readily form single orientation cube-on-cube epitaxy on cube textured Ni. Deposition of $CeO_2$ using a range of deposition techniques can be done using a background of forming gas (4% $H_2$-96% Ar) in the presence of small amounts of water vapor. Under such conditions the formation of NiO is thermodynamically unfavorable while the formation of $CeO_2$ is thermodynamically favorable. The water vapor provides the necessary oxygen to form stoichiometric $CeO_2$. Using $CeO_2$ as a buffer layer one can readily obtain a single orientation, sharp cube texture. Ideally, the $CeO_2$ layer would be grown thick such that it also provides a chemical diffusion barrier from Ni, followed by deposition of YBCO. However, when the $CeO_2$ layer is grown greater than 0.2 µm in thickness, it readily forms micro-cracks. Hence a YSZ layer which does provide an excellent chemical barrier to diffusion of Ni and does not crack when grown thick is deposited on a thin initial template of $CeO_2$. However, since there is a significant lattice mismatch between YSZ and YBCO, a second phase with 45°-rotated orientation nucleates at times. In order to avoid the nucleation of this second orientation completely, a thin capping layer of $CeO_2$ or another material is deposited epitaxially on the YSZ layer.

The fabrication of the buffer layer stack can be a time consuming, and cost limiting, factor in the process of fabricating superconducting articles. Accordingly, there is a need for improved methods of forming buffer layer stacks and in particular the seed layer. Efforts are being made to replace the existing three layer RABiTS architecture of all-sputtered $CeO_2$ (or $Y_2O_3$)/YSZ/$Y_2O_3$ with buffers deposited by industrially scalable solution methods. Metal organic deposition (MOD) processes offer significant cost advantages compared to physical vapor deposition (PVD) processes. About 0.8 µm thick MOD-YBCO films grown on sputtered-$CeO_2$ capped MOD-LZO films processed at 900° C. supported an $I_c$ of 336 A/cm width ($J_c$ of 4.2 $MA/cm^2$) at 77 K and self-field. This performance demonstrated the barrier properties of MOD-LZO and exceeded the typical 300 A/cm performance of all-PVD buffers. The barrier properties of LZO were demonstrated by growing MOD-LZO on sputtered $Y_2O_3$ seeds. Sputtered $Y_2O_3$ seed layers improve the texture relative to the substrate texture. The challenge is to develop an MOD seed layer with improved texture. MOD-$Y_2O_3$ seeds grown directly on textured Ni-3W substrates did not show any improvement. However, recently, the growth of MOD-$La_3TaO_7$ (LTO) and MOD-$CeO_2$ seeds with improved texture on textured Ni-3W substrates has been demonstrated. MOD-LTO seeds were not compatible with MOD-LZO and $CeO_2$ and also with sputtered-YSZ barriers. However, MOD-$CeO_2$ seeds were compatible with sputtered YSZ and $CeO_2$ and high $I_c$ YBCO films were demonstrated. It is important to limit the thickness of $CeO_2$ seeds to 40 nm or less to avoid the crack formation. Hence, there is a real need to develop another suitable solution seed with improved texture.

SUMMARY OF THE INVENTION

A method of making a superconducting article includes the steps of providing a biaxially textured metal or alloy substrate; epitaxially depositing by a chemical solution process a seed layer comprising a double perovskite on the substrate, the seed layer comprising a double perovskite of the formula $A_2B'B''O_6$, where A is rare earth or alkaline earth metal and B' and B" are different rare earth or transition metal cations; and epitaxially depositing a superconductor layer epitaxially such that the superconductor layer is supported by the seed layer. The chemical solution process can be selected from MOD, sol-gel alkoxide precursors, TFA-MOD, non-fluorine processes, and reduced fluorine processes.

A can be selected from the group consisting of Ba, Ca, or Sr. B' can be selected from the group consisting of Y and RE (RE=La—Lu). B" can be Nb or Ta. The seed layer can be $Ba_2(Y,RE)NbO_6$ or $Ba_2(Y,RE)TaO_6$.

The substrate can comprises at least one of the group consisting of Ni—W, Ni—Cr, Ni—Cr—W, Ni—Cr—V, Ni—V, Cu—Ni, Cu—Pd, and Ni—Mn. The superconducting layer can be any suitable superconductor, such as REBCO with and without self-aligned barium zirconate nano-rods or nano-dots.

BRIEF DESCRIPTION OF THE DRAWINGS

A fuller understanding of the present invention and the features and benefits thereof will be obtained upon review of the following detailed description together with the accompanying drawings, in which.

DETAILED DESCRIPTION OF THE INVENTION

Figure 1:
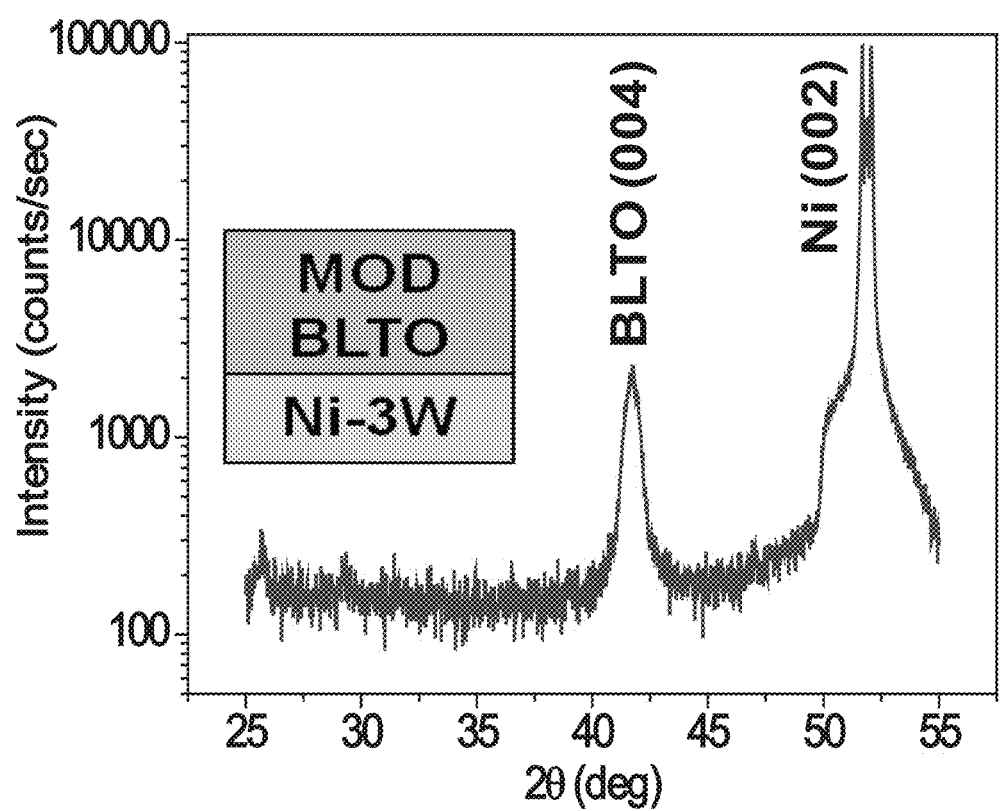
FIG. 1 includes θ-2θ scans for a single coat 40-nm thick MOD-$Ba_2LaTaO_6$(BLTO) films deposited on Ni-3W substrates. BLTO films have a preferred c-axis orientation.

The invention utilizes a chemical solution deposited double perovskite, such as $Ba_2(Y$ and/or $RE)NbO_6$ or $Ba_2(Y$ and/or $RE)TaO_6$, for growing the seed layer on RABiTS tapes or other textured substrates. Since this phase has a large lattice mismatch with Ni-based alloys, it is expected that the out-of-plane texture of the double perovskite seed layer will be better than that of the Ni-based alloy substrate. The double perovskite seed layer may also serve as a better diffusion barrier layer since it has low reactivity and may also have less diffusion of cation elements through it and will be low-cost compared to a layer deposited by another technique. The double perovskite layer can also be deposited by physical vapor deposition techniques such as electron or thermal evaporation, sputtering, pulsed laser deposition, metal-organic chemical vapor deposition, and the like.

Superconducting articles according to the invention include a double perovskite seed layer, a biaxially textured substrate and a biaxially textured superconducting layer. The term "seed layer" as used herein means that the double perovskite layer is in physical contact with the biaxially textured substrate, and can be interposed directly between the substrate and the superconducting layer or there can be additional layers between the superconducting layer and the double perovskite seed layer.

Double perovskites useful for the invention have the general formula $A_2B'B''O_6$, where A is rare earth (RE) or alkaline earth metal and B' and B" are different RE or transition metal cations. A can be Ba, Ca, or Sr. B' can be Y, RE. B" can be Nb or Ta.

The invention incorporates a seed layer of the double perovskite phase, such as $Ba_2(Y$ and/or $RE)NbO_6$ or $Ba_2(Y$ and/or $RE)TaO_6$, for growing the superconducting film. Since this phase has a large lattice mismatch with REBCO or YBCO films, it is expected that the c-axis of the YBCO phase will sharply tilt towards the substrate normal. When this happens, the full-width-half-maximum of the rocking curve or the omega scans both for rocking in the rolling direction and about the rolling direction, can sharpen considerably, which can result in a YBCO or REBCO layer with a FWHM of the out-of-plane texture of only a few degrees. This may in turn also make the FWHM of the in-plane texture sharper. This improvement in texture could result in significant enhancement in the critical current density of the films. Also, unlike the presently used buffer layers of $CeO_2$ and $LaMnO_3$, wherein reaction with YBCO or REBCO are observed, the double perovskite phase $Ba_2(Y$ and/or $RE)NbO_6$ or $Ba_2(Y$ and/or $RE)TaO_6$ have essentially no reaction with REBCO or YBCO.

The chemical solution process can be any that is suitable to deposit the double perovskite seed layer on the biaxially textured substrate. Currently available processes include those such as metal organic deposition using sol-gel alkoxide precursors, trifluoroacetates precursor solution (TFA-MOD), non-fluorine MOD processes, and reduced fluorine MOD processes. Other chemical solution deposition processes suitable for depositing double perovskite seed layers are possible.

A buffer system in addition to the seed layer can be provided and generally comprises the layers between the seed layer and the superconductor layer. Buffer systems in accordance with the present invention can comprise any known architecture, and can be deposited on the seed layer by any known means. Differing buffer layers can be utilized to impart desired properties to the overall structure, including, but not limited to, providing an effective chemical barrier for diffusion of deleterious elements, preventing deleterious reactions with adjacent layers or during the formation of adjacent layers, providing a good structural transition between layers, and providing a high degree of epitaxy with adjacent layers. The buffer layers should in some cases also have good mechanical properties, and high electrical and/or thermal conductivity.

Some examples of suitable buffer layer deposition methods include, but are not limited to: physical vapor deposition (PVD) which includes pulsed laser deposition (PLD), electron beam evaporation, sputtering (reactive, rf, dc, for example), etc.; chemical vapor deposition (CVD) which includes metal-organic CVD (MOCVD), solgel deposition, metal-organic deposition, spray pyrolysis, and plasma spray; and plating methods such as electrodeposition and electroless deposition.

Some examples of suitable buffer layers include, but are not limited to TiN, $CeO_2$, $Y_2O_3$, $SrTiO_3$, $BaZrO_3$, $BaSnO_3$, $BaCeO_3$, YSZ, $(RE_{1-x}Sr_x)MnO_3$, $REMnO_3$, $RE_2O_3$, $REAlO_3$, $RE_2Zr_2O_7$, $RE_3NbO_7$, RESMO, and REMO where RE comprises at least one rare-earth element, namely Y, La, Ce, Pr, Nd, Pm, Sm, Eu, Gd, Tb, Dy, Ho, Er, Tm, Yb, and Lu, and where M comprises at least one metal. Some specific examples of suitable conductive buffer layers are $LaNiO_3$, $LaO_7$, $CaO_3$, $MnO_3$, $LaCoO_3$, $LaO_5$, $SrO_5$, $TiO_3$, $SrRuO_3$, and $La_2CuO_4$. Multiple layer architectures are also known.

The invention provides for the growth of a solution-based double perovskite buffer layer directly on Ni—W with improved out-of-plane texture. The development of an all-solution buffer/YBCO process to fabricate these layers can provide potentially lower-cost, high performance second generation coated conductors, with a goal to demonstrate an Ic of 300 A/cm width for all-solution buffers on RABiTS. Double perovskite oxides such as $Ba_2YNbO_6$ do not react with YBCO. Hence, it is desirable to grow double perovskite based solution seeds.

$Ba_2LaTaO_6$ (BLTO) has been identified as a potential buffer layer. Ni-3W (3 at. wt. %) substrates were cut to 1-cm wide and 4-cm long and 50-μm thick tapes. About 0.25 M, 10 ml BLTO precursor solutions were prepared from Barium metal (Alfa, 0.172 g), Lanthanum isopropoxide (Alfa, La 40% assay, 0.198 g), Tantalum ethoxide (Alfa, 0.254 g), and 2-methoxyethanol (Alfa, spectrophotometric grade). About 0.25 M total cation concentration was used to grow 40-nm thick BLTO films in a single coat on Ni-3W substrates. Spin coating was used to deposit BLTO films at a spin rate of 4000 rpm for 30 sec in a controlled humidity of 40-60%. The spin coated films were then crystallized at 1050° C. for 18 min in a flowing gas mixture of $Ar/H_2$ 4%, and subsequently quenched to room temperature.

Figure 2:
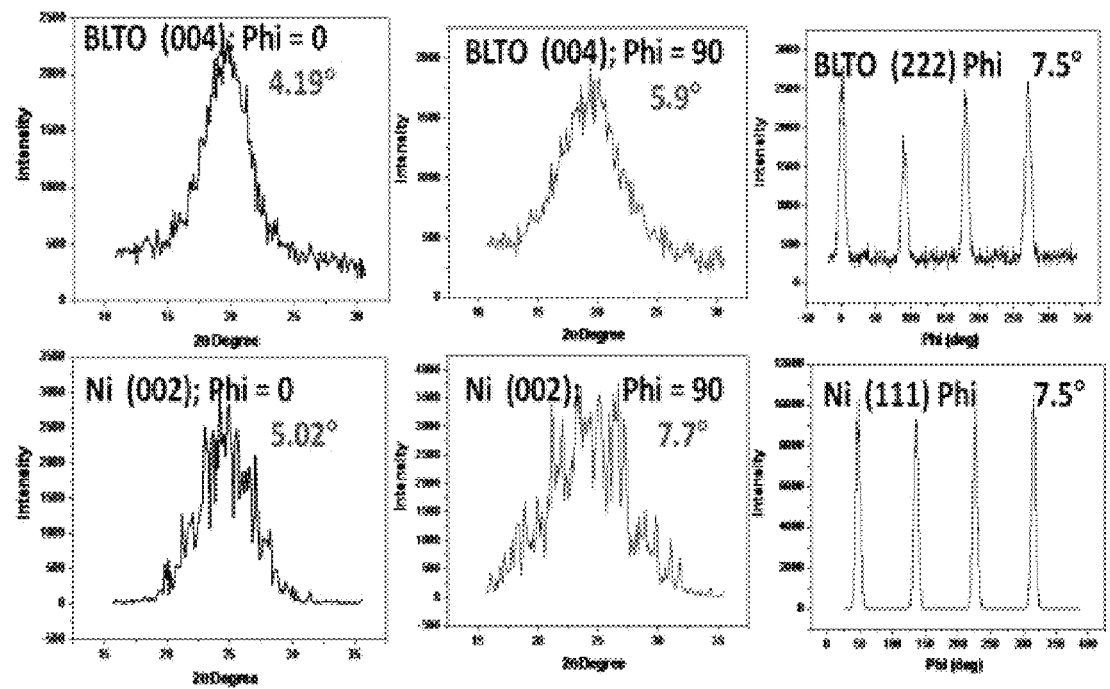
FIG. 2 includes Omega scans and Phi scans for single coat 40-nm thick MOD-BLTO films deposited on Ni-3W substrates.
Figure 3:
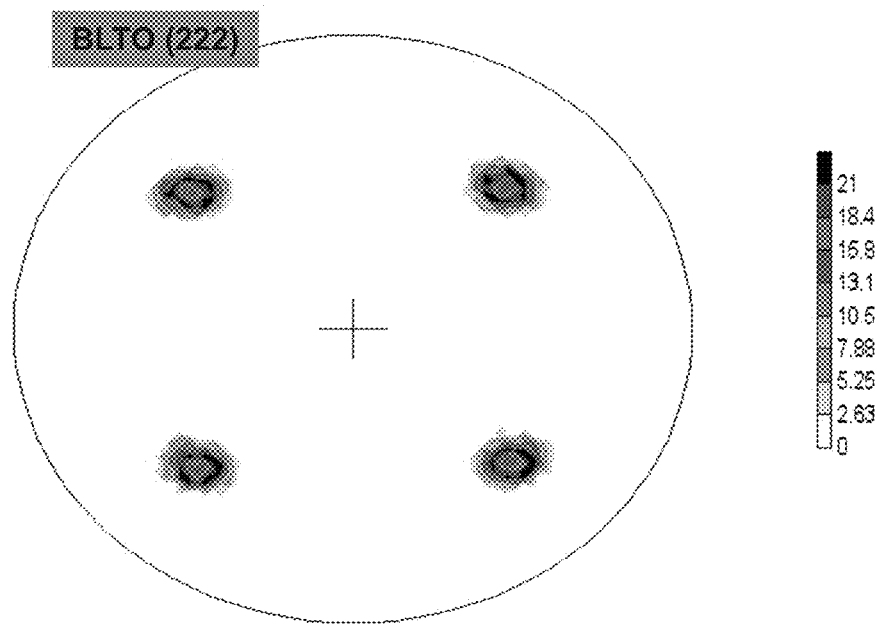
FIG. 3 includes (222) BLTO pole figure for single coat 40-nm thick MOD-BLTO films deposited on Ni-3W substrates. Four-fold symmetry indicates the presence of a cube textured BLTO films on Ni—W substrates.
Figure 4:
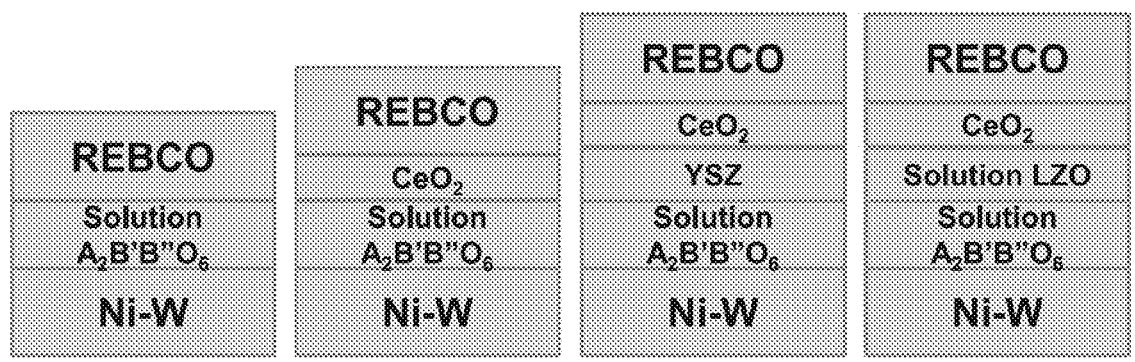
FIG. 4 indicates the possible schematic multi-layer architectures based on the double perovskite solution seeds of the formula $A_2B'B''O_6$, where A is rare earth or alkaline earth metal and B' and B" are different rare earth or transition metal cations.

Highly textured MOD-BLTO films with improved out-of-plane texture compared to the texture of underlying Ni-3W substrates were achieved. The 0-20 XRD patterns for single-coat 40-nm thick BLTO seed layers are shown in FIG. 1. The BLTO films have a preferred c-axis orientation. Both out-of-plane and in-plane texture data and (222) BLTO pole figure on BLTO films are reported in FIGS. 2 and 3, respectively. The full width at half maximum (FWHM) values for Ni—W (002), and BLTO (004) are 5.02°, and 4.19° (in the rolling direction) and 7.7°, and 5.9° (about the rolling direction), and those of Ni—W (111), and BLTO (222) are 7.5°, and 7.5°, respectively. The four-fold symmetry in the BLTO (222) pole figure (FIG. 3) indicates the presence of a cube textured BLTO films on Ni—W substrates. This demonstrates that the invention can provide a route for producing low-cost MOD buffer layers for YBCO coated conductors. Several other architectures can also be developed on double perovksite seeds. The specific examples are shown in FIG. 4: Ni—W/$Ba_2$(Y and/or RE)$NbO_6$ or $Ba_2$(Y and/or RE)$TaO_6$/REBCO; Ni—W/$Ba_2$(Y and/or RE)$NbO_6$ or $Ba_2$(Y and/or RE)$TaO_6$/YSZ/$CeO_2$/REBCO; Ni—W/$Ba_2$(Y and/or RE)$NbO_6$ or $Ba_2$(Y and/or RE)$TaO_6$/$CeO_2$/REBCO; Ni—W/$Ba_2$(Y and/or RE)$NbO_6$ or $Ba_2$(Y and/or RE)$TaO_6$/LZO/$CeO_2$/REBCO.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

We claim:

1. A method of making a superconducting article, comprising the steps of:
   providing a biaxially textured metal or alloy substrate;
   epitaxially depositing directly on the substrate by a chemical solution process a biaxially textured seed layer comprising a double perovskite on the substrate, the seed layer comprising a double perovskite of the formula A2B'B"O6, where A is rare earth or alkaline earth metal and B' and B" are different rare earth or transition metal cations; and
   epitaxially depositing directly on the seed layer a biaxially textured superconductor layer such that the superconductor layer is supported by the seed layer.

2. The method of claim 1, wherein the chemical solution process is selected from MOD, sol-gel alkoxide, TFA-MOD, non-fluorine processes, and reduced fluorine processes.

3. The method of claim 1, wherein A is selected from the group consisting of Ba, Ca, or Sr.

4. The method of claim 1, wherein B' is selected from the group consisting of Y and/or RE.

5. The method of claim 1, wherein B" is Nb or Ta.

6. The method of claim 1, wherein the seed layer is $Ba_2$(Y and/or RE)$NbO_6$ or $Ba_2$(Y and/or RE)$TaO_6$.

7. The method of claim 1 wherein at least a portion of said substrate comprises at least one of the group consisting of Ni—W, Ni—Cr, Ni—Cr—W, Ni—Cr—V, Ni—V, Cu—Ni, Cu—Pd, and Ni—Mn.

8. The method of claim 1 wherein said superconducting layer is REBCO.

9. A method of making a superconducting article, comprising the steps of:
   providing a biaxially textured metal or alloy substrate;
   epitaxially depositing directly on the substrate by a chemical solution process a biaxially textured seed layer comprising a double perovskite on the substrate, the seed layer comprising a double perovskite of the formula A2B'B"O6, where A is rare earth or alkaline earth metal and B' and B" are different rare earth or transition metal cations; and epitaxially depositing a biaxially textured superconductor layer such that the superconductor layer is supported by the seed layer; and;

epitaxially depositing a biaxially textured buffer layer between said double perovskite seed layer and the superconductor layer that is different from the material comprising the double perovskite seed layer.

10. The method of claim 9, wherein the superconductor layer comprises YBCO.

* * * * *